(12) United States Patent
Dutta

(10) Patent No.: US 7,432,775 B2
(45) Date of Patent: Oct. 7, 2008

(54) HIGH SPEED ELECTRONICS INTERCONNECT HAVING A DIELECTRIC SYSTEM WITH CYLINDRICAL HOLES THEREIN

(75) Inventor: Achyut Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 0 days.

(21) Appl. No.: 10/793,362

(22) Filed: Mar. 4, 2004

(65) Prior Publication Data

US 2004/0174223 A1    Sep. 9, 2004

Related U.S. Application Data

(60) Provisional application No. 60/451,950, filed on Mar. 5, 2003.

(51) Int. Cl.
*H01P 3/08* (2006.01)

(52) U.S. Cl. .......................................... 333/1; 333/238
(58) Field of Classification Search .................. 333/1, 333/238, 246
See application file for complete search history.

(56) References Cited

U.S. PATENT DOCUMENTS

| 5,065,122 | A | * | 11/1991 | Juskey et al. ............... 333/238 |
| 5,158,820 | A | * | 10/1992 | Scammell ................... 428/138 |
| 5,227,742 | A | * | 7/1993  | Suzuki ........................... 333/1 |
| 5,426,399 | A | * | 6/1995  | Matsubayashi et al. ........ 333/1 |

\* cited by examiner

*Primary Examiner*—Benny Lee

(57) ABSTRACT

Fundamental interconnect systems for connecting high-speed electronics elements are provided. The interconnect systems consists of the signal line, dielectric system with opened trench or slot filled up with the air or lower dielectric loss material, and the ground plane. The signal line could be for example, microstripline, strip line, coplanar line, single ended or differential pairs. The interconnect system can be used for on-chip interconnects or can also be used for off-chip interconnects (chip-to-chip interconnects). The fundamental techniques provided in this invention can also be used for high-speed connectors and high-speed cables. More over, this fundamental technology is also used for the high sped die package, high speed connector, and high speed cables where conventional manufacturing technology can be used and yet to increase the bandwidth of the interconnects.

2 Claims, 18 Drawing Sheets

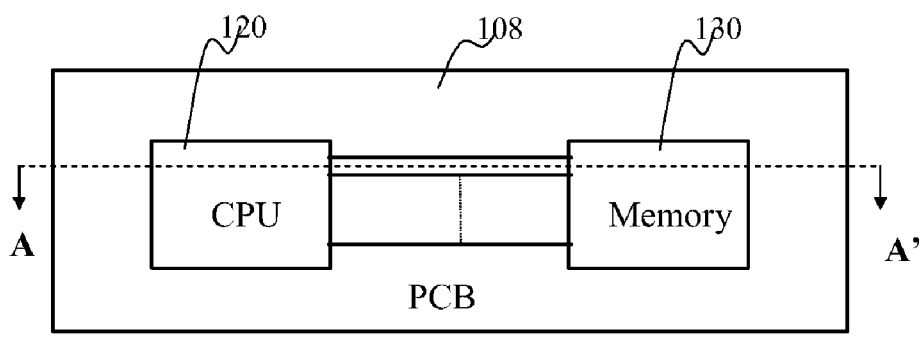
FIG. 2A
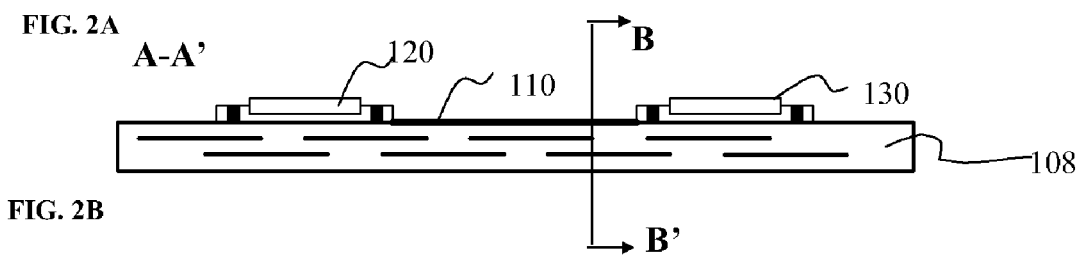
FIG. 2B
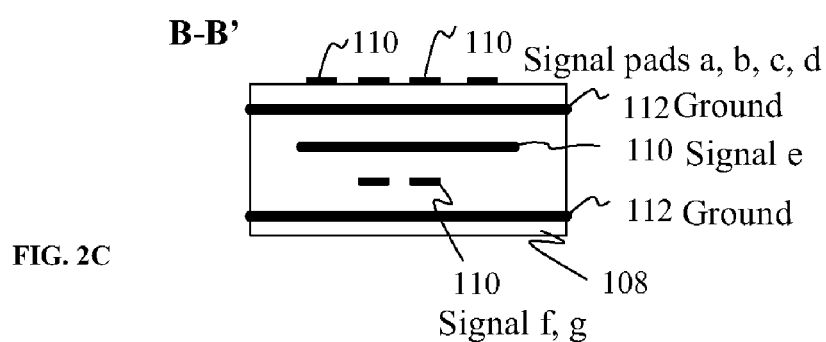
FIG. 2C
**FIG. 2
PRIOR ART**

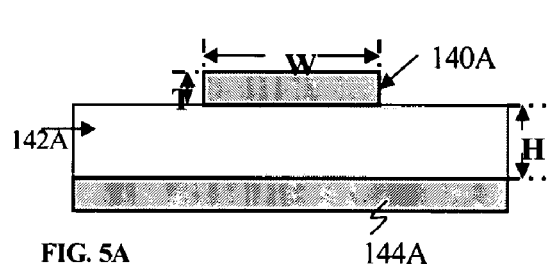
FIG. 5A
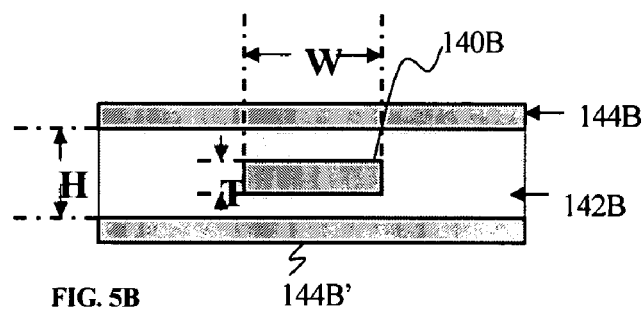
FIG. 5B
**FIG. 5
PRIOR ART**
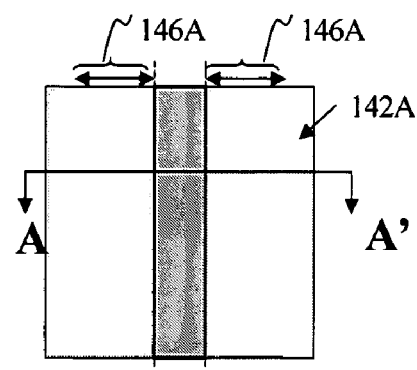
FIG. 6A
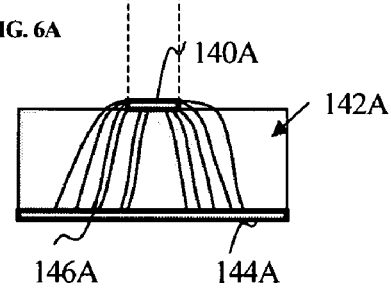
FIG. 6B
**FIG. 6
PRIOR ART**

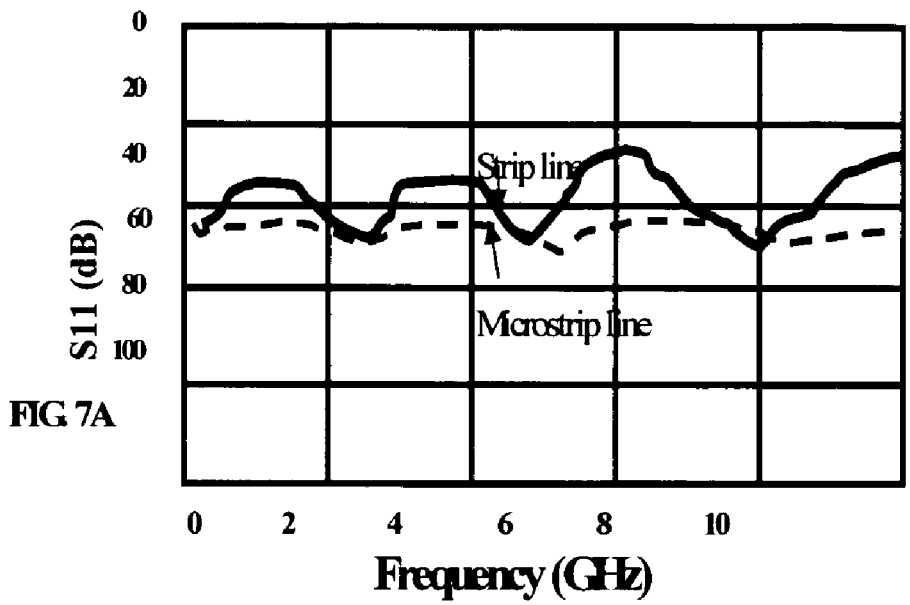
FIG. 7A
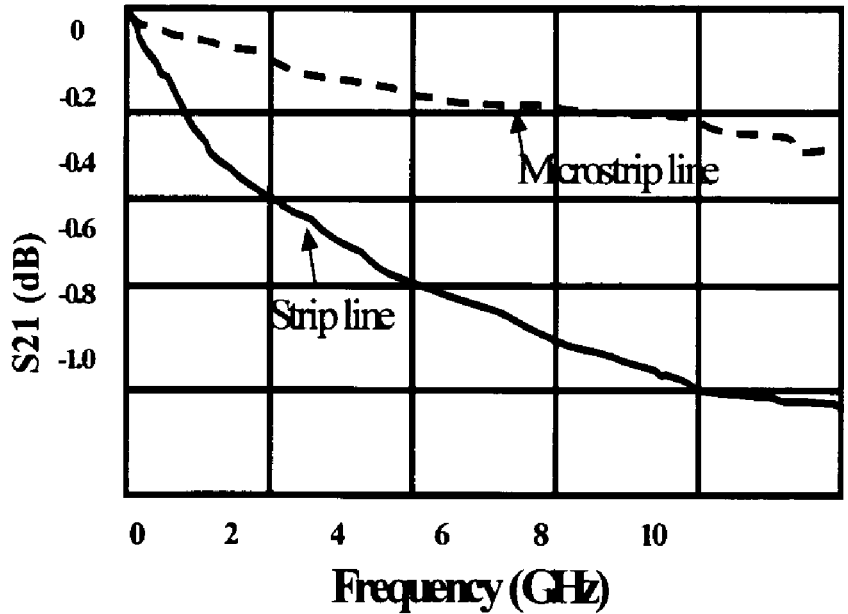
FIG. 7B
FIG. 7
PRIOR ART

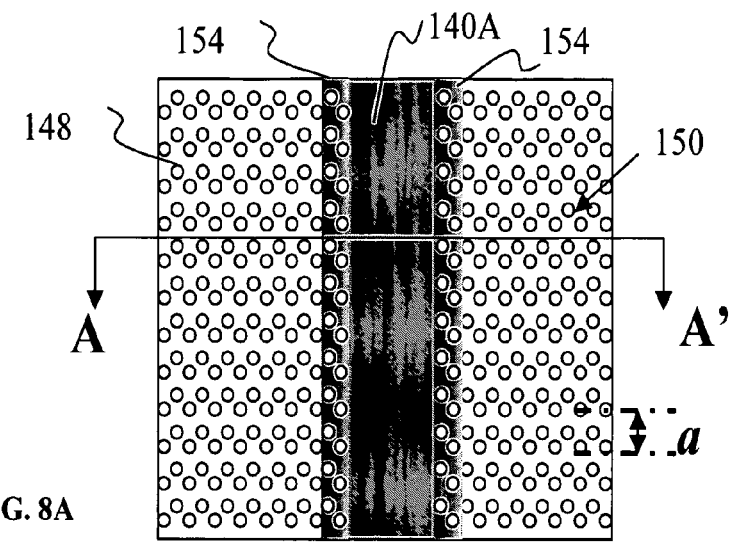
FIG. 8A
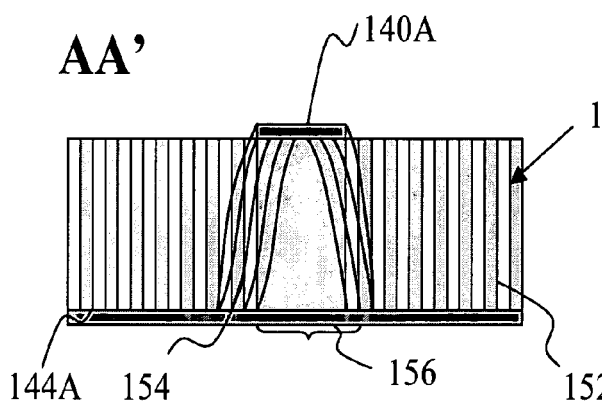
FIG. 8B
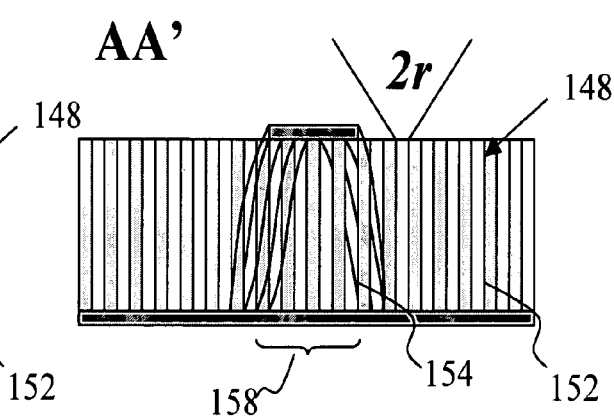
Fig. 8C
FIG. 8

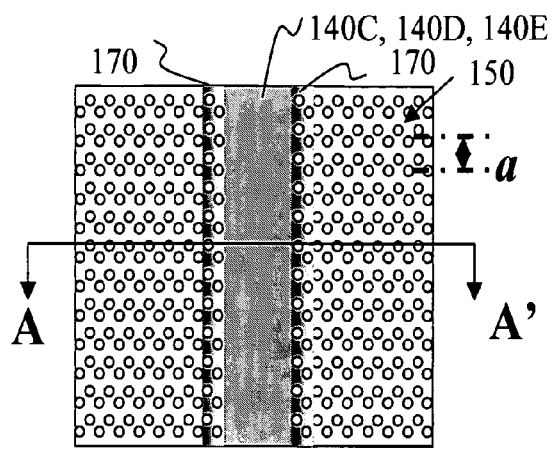
FIG. 10A
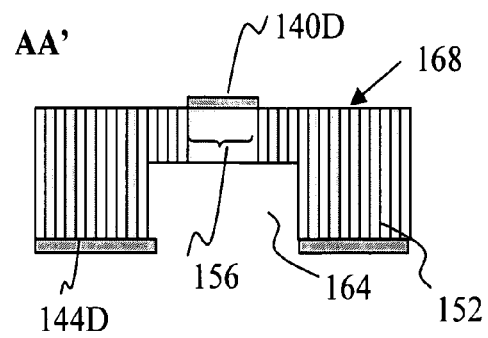
FIG. 10C
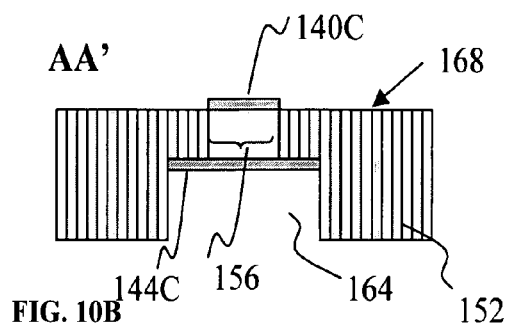
FIG. 10B
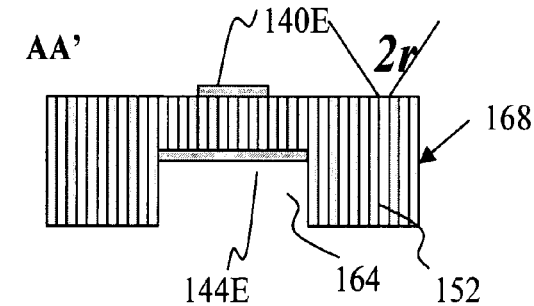
FIG. 10D
FIG. 10

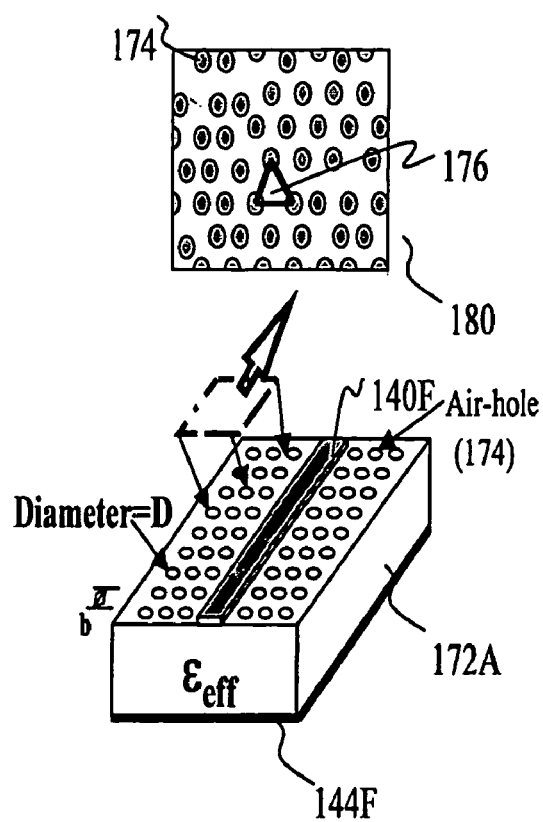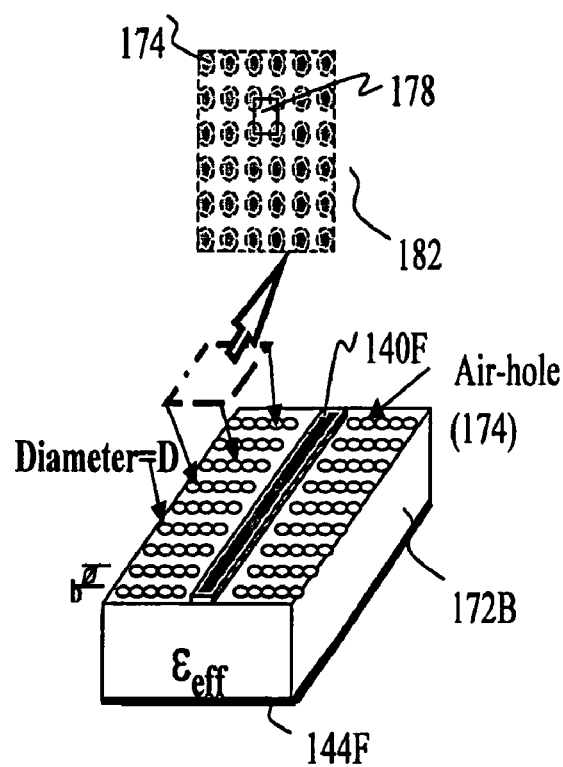
FIG. 11A
FIG. 11B

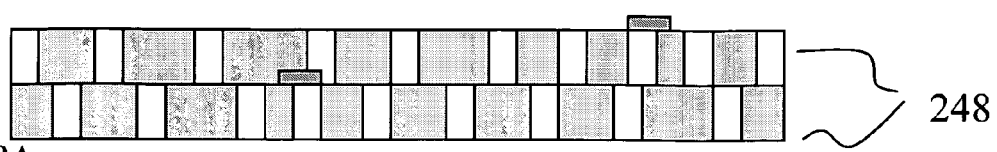
FIG. 18A
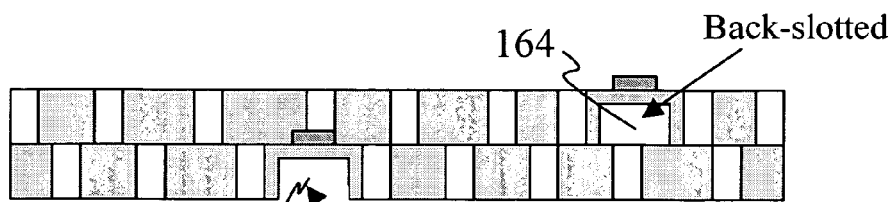
FIG. 18B
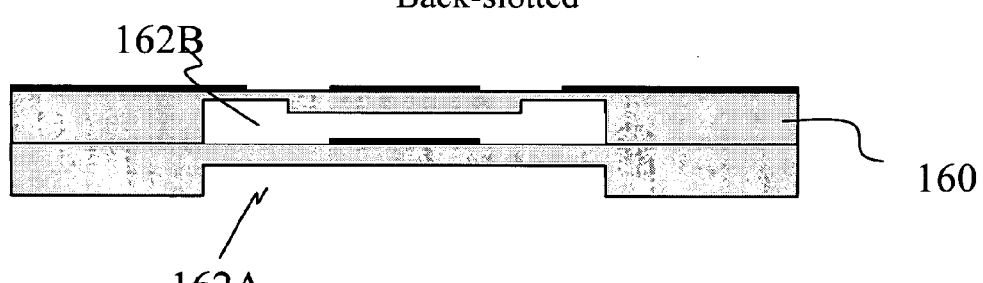
FIG. 18C
FIG. 18

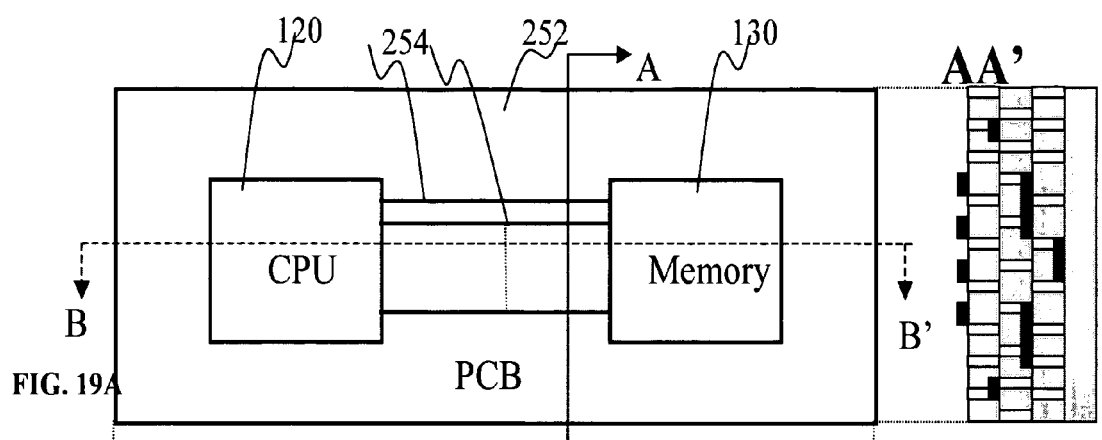
FIG. 19A
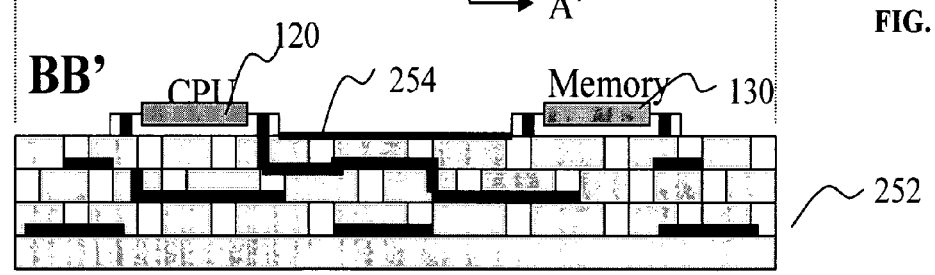
FIG. 19C   FIG. 19
FIG. 19B

HIGH SPEED ELECTRONICS INTERCONNECT HAVING A DIELECTRIC SYSTEM WITH CYLINDRICAL HOLES THEREIN

CROSS REFERENCE TO RELATED APPLICATIONS

This application claims the benefit of U.S. Provisional Application No. 60/451,950 filed Mar. 5, 2003.

FIELD OF THE INVENTION

This invention relates to interconnection of electronic elements on-chip (hereinafter also referred as intra-chip), and off-chip (hereinafter also referred as inter-chip) interconnection, high-speed connectors, and cable fabrication. More particularly, this invention is related to (a) connecting two or more electronic devices within a chip (on-chip or intra-chip connection), (b) connecting on a circuit board, a high speed signal line of single, or multi processor chips to a signal line of single, or multi memory chips (off-chip or inter-chip) which are used in computers ranging from personal computers to super-computers, and game systems, (c) interface means (e.g., a connector or a cable) to connect two or more high speed electronic elements, and (d) high-speed chip packaging to connect the chip (die) to the package. This invention is also related to high-speed electrical interconnection, optical interconnection, or both electrical and optical interconnection where two or more high-speed electrical and/or optical elements are to be connected.

BACKGROUND OF THE INVENTION

The level of integration within integrated circuits (ICs) has led to larger numbers of IC interconnections as well as higher data rates. Today, typical signal speed of ICs is approximately 3 GHz, and shortly it will reach 10 GHz and higher. The number of interconnections required in a single IC (e.g., a single processor) may be close to 2000, and shortly that number will increase to over 5000. Simultaneously achieving higher data rates and higher numbers of on-chip, and off-chip interconnection densities (number of interconnections per unit area) is becoming increasingly difficult as IC technologies continue to evolve. For example, in on-chip cases, as the number of electronic devices such as transistors, are increased, interconnecting the electronic devices without sacrificing the signal speed is more and more challenging. Similarly, in off-chip cases, high density of interconnections, including die-level and chip-to-chip packaging (hereafter "chip" indicates the die with package) on the printed circuit board (PCB), will also be increasingly difficult.

Therefore, increasing the signal speed and number of interconnections within, and outside the ICs by using a low-cost, high-level interconnection technique compatible with existing manufacturing processes, is highly desirable.

It is generally known in the art that at signal speeds below a few Megahertz (MHz), electronic devices (both on-chip and off-chip) are interconnected using a metal conductor for example, a metal wire, for electrical signals to flow. However for speeds higher than a few MHz, both on-chip and off-chip signals must propagate through impedance matched transmission lines. Any discontinuities in the electrical signal line or via holes (conducting pathways between two or more substrates/layers) due to impedance mismatch causes reflection thereby degrading the signal waveform propagating through the electronic devices. At multi GHz frequencies, the transmission line loss which is the sum of the conductor loss and the dielectric loss are dependent on the transmission frequency. Significant attenuation and rise-time degradation can be caused by losses in the transmission line. Furthermore, interconnection lengths become a significant fraction of the wavelength of the high frequency harmonics. Therefore, interconnections must be designed with proper concern for impedance, cross talk, and attenuation. Impedance mismatch must be minimized to reduce the reflections and prevent ringing, which can cause a false decision (switching) in the receiver.

At present, technology development is pushing towards a reduction in the size of the electronic device, resulting in utilization of a larger number of devices inside a single chip. As the level of integration of future 'system-on-a-chip' design is increasing, chip areas are also increasing. There is high demand for a novel interconnection technique that is compatible with standard IC fabrication technology, while preserving the signal speed, and assuring adequate isolation for high-speed data communication. As the on-chip signal speed increases, the off-chip signal speed also increases, thereby requiring new techniques for off-chip interconnections that are compatible with the current PCB technology.

FIG. 1 and FIG. 2 are schematics that show parts of conventional on-chip and off-chip interconnections. In particular, an on-chip interconnection shown in FIG. 1, comprises a single substrate 100 including an electronic device 102 connected by metal conductors 104. The metal conductors are typically made of materials including aluminum (Al), copper (Cu), tungsten (W), and tungsten silicide (WSi). One or more dielectric layers 106 comprising for example silicon oxide (for a Si devices), isolate the device from other metal conductors and from other devices (not shown here).

A schematic of an off-chip interconnection is shown in FIG. 2, wherein a chip 120 (for example, a CPU processor) is connected to another chip 130 on a PCB 108, by multilayered electrical signal lines 110. FIG. 3 and FIG. 4 respectively, show a schematic representation of a conventional BGA (ball grid array) and a CSP (chip-scaled package) packaging for a high-speed single chip package (for example, a processor). In both types of packaging, a die 122 (FIG. 3) or a die 132 (FIG. 4) are attached to a ceramic or a polymer substrate 134 (FIG. 4), respectively, containing the matrix of pins 126 (FIG. 3) and 136 (FIG. 4). Outside pins 128 (FIG. 3) and 138 (FIG. 4), located at the bottom-side of the chip package (not shown in both packaging cases), connect with the PCB 108. Heat sinks are attached to the top side of the dies to dissipate heat from the dies. The signal fidelity occurs due to the conventional inter-chip electrical signal connections 110 and ground/power 112 connections through the multilayered PCB 108. It is highly desirable to have board-level electrical interconnections for high-speed inter-chip connection, which are compatible with existing IC packages such as BGA, CSP, etc., as well as conventional PCB technologies.

Interconnection technology for both on-chip (intra-chip) and off-chip (inter-chip) interconnections is mainly based on a microstrip line type or a strip-line type transmission line layout laid on a dielectric material. FIG. 5A shows a cross-sectional view of a microstrip line type transmission line layout having a trace routed for example at a top or a bottom layer of a PCB, in an off-chip interconnection. An electrical conductor 140A to be referred as a "signal" line hereinafter, with a width W and a thickness T is laid on a dielectric material 142A having height H. A ground and/or a power line 144A is located on the bottom side of the PCB, opposite from the signal line 140A. FIG. 5B is the cross-sectional view of a strip-line type transmission line layout, which has a trace 140B routed on the inside of the PCB layer 142B and has two voltage-reference planes (i.e. power and/or ground) 144B and 144B'. The impedances of the microstrip line type and the strip-line type-transmission lines are expressed by the following equations, respectively:

$$Z_{microstrip} = [(87/\text{Sqrt}.(\in_r + 1.41)] \ln [(5.98 \times H)/(0.8W+T)]\Omega \quad (1)$$

$$Z_{strip} = [(60/\text{Sqrt}.(\in_r))]] \ln [(4H)/(0.67\pi(0.8W+T))]]]\Omega \quad (2)$$

Equations (1) and (2) indicate that the impedance is directly proportional to the dielectric constant $\in_r$ and the trace height H, and is inversely proportional to the trace width W and the trace thickness T. In a strip-line layout, the signal line is confined within the dielectric layer, whereas in a microstrip line layout the signal line is open to air. In a microstrip line type trace, the electrical field is in the dielectric layer as well as in the air, whereas in a strip-line type trace, the field is confined inside the dielectric layer. Hence, the effective dielectric constant in the strip-line layout is higher as compared to in the microstrip line layout. There is also less dielectric loss (also referred as dielectric loss tangent) in the microstrip line layouts as compared to the strip-line layout. The higher effective dielectric loss in the strip-line layout results in higher dispersion or signal loss as compared to the microstrip line layout. FIG. 6 in a top view and a cross-sectional view of a microstrip line type transmission line layout shows the electrical field distribution. The electrical field 146A spreads to both sides of the signal line 140A. FIG. 7A and FIG. 7B show frequency responses of microstrip line and strip-line layouts. For the same dielectric material, the effective dielectric constant of the strip-line layout is higher than that of the microstrip line layout. The signal is attenuated more in the strip-line layout at higher frequencies. Therefore, to increase the bandwidth of the interconnection, the effective dielectric loss should be kept low.

A high-speed signal while propagating through the transmission line, experiences a propagation delay which is dependent on the dielectric constant of the material. The propagation delay $t_{PD}$ for strip line and microstrip line type transmission lines are expressed by the following equations, respectively:

$$t_{PD\ microstrip} = 85 [\text{Sqrt}.(0.475\in_r + 0.67)] \quad (3)$$

$$t_{PD\ stripline} = 85 [\text{Sqrt}.(\in_r)] \quad (4)$$

Equations (3) and (4) indicate that as $\in_r$ increases, the propagation delay also increases. A microstrip line layout has comparatively lower propagation delay than a strip line layout for the fixed dielectric constant $\in_r$.

A signal experiences more propagation delay in a transmission line laid on a dielectric medium having a high dielectric constant compared to a dielectric medium having a low dielectric constant. This causes signal skews for different length signal lines. Therefore, a lower-dielectric constant medium is preferred in constructing on-chip and off-chip high-speed signal interconnections. A dielectric medium having a low dielectric constant and a low dielectric loss tangent offer the following advantages:

(1) A reduction in cross-talk allows higher on-chip and off-chip interconnection density, (2) a reduction in interconnection capacitance allows signal propagation over longer distances, (3) a lower propagation delay, and (4) a reduction in microwave loss due to confinement of the electric field near the signal line, which helps signal propagation over longer distances. Therefore, it is advantageous to transmit high speed signals in a medium having a low dielectric constant as compared to a medium having a high dielectric constant with substantially the same dielectric loss tangent.

Besides the dielectric constant of the medium, the type of signal line, the microwave loss, and the material used for conductor electrode structure also limits the bandwidth of an interconnection. Microwave-loss occurs due to the electrode structure material, mainly as a result of the skin-depth of the signal. As skin-depth of copper at 100 GHz is about 0.2 μm, therefore loss due to the skin-depth in a copper conductor electrode may be neglected. In that case, the bandwidth of the interconnection (on-chip and off-chip) is mainly dependent on the following factors:

(1) length of the interconnection;

(2) microwave-loss, originating from, (a) dielectric constant, (b) dielectric loss tangent, and (c) electrode structure material. As the length of the interconnection in on-chip and off-chip applications varies from a few micrometers to about 10 to 30 cm, the dependence on interconnection length can be neglected. Therefore, the interconnection bandwidth is mainly dependent on the dielectric constant and the dielectric loss tangent.

Those skilled in the art will appreciate that it is preferable to use a material having a low dielectric constant as well as a lower dielectric loss tangent. Therefore, it is necessary to develop new materials, and new manufacturing technology for constructing on-chip and off-chip interconnections.

Currently, a lot of work is focused on developing new materials for on-chip and off-chip interconnection technology. For example, for on-chip interconnection, it is possible to find low-K materials having a dielectric constant between 3.0 and 4.5, which is lower than the dielectric constant of non-doped silicon oxide. However, beyond that, it will be necessary to find other materials. In addition, incorporating new materials in the chip fabrication process is expensive in short term until the technology matures. At present, developing low-K materials for on-chip interconnection is expensive and time consuming. On the other hand, for off-chip interconnection, and especially for chip-to-chip interconnection, efforts are focused on shortening the length of the interconnection and/or the interconnection layout. In both cases, IC manufacturing costs would increase in implementing new technology.

With growing demand on higher signal speeds and larger bandwidth interconnections, the conventional technology currently being used for on-chip and off-chip interconnection cannot be continued without incurring higher cost. It is desirable and even cost effective to adopt new materials having a lower dielectric constant and lower dielectric loss tangent and manufacturing methods that are compatible with current IC and PCB manufacturing technology.

SUMMARY OF THE INVENTION

Accordingly, it is an object of the invention to provide a technique for increasing the bandwidth of on-chip and off-chip interconnections by reducing the effective dielectric constant and effective dielectric loss tangent of dielectric materials used in interconnection system to increase the bandwidth of the interconnection.

It is also an object of the invention to provide a technique to localize the electrical field in the signal line and to prevent the electrical field from distributing away from the electrical conductor.

It is also an object of this invention to provide the interconnection structure having low microwave-loss.

Another object of the present invention is to provide an on-chip interconnection which is compatible with IC fabrication technology.

Another object of the present invention is to provide an off-chip interconnection which is compatible with available PCB technology.

Another object of this invention is to provide a structure for making a high bandwidth connector and cable by using existing interconnection materials.

Another object of this invention is to provide a method for fabricating high speed on-chip interconnections using standard fabrication processes.

Another object of this invention is to provide a method for fabricating high speed off-chip interconnections on a PCB board using standard PCB manufacturing technology.

According to the invention, an interconnection system comprises:
 (i) single or multiple electrical conductors (signal lines hereinafter) for carrying one or more electrical signals from one electronics elements to another for electrical communication;
 (ii) a dielectric system designed to handle a desired signal frequency, comprising a dielectric medium having periodic arrays of dielectric spheres or cylinders with certain predetermined diameter and pitch, located outside the electrical "signal" lines;
 (iii) a ground and/or a power line on the opposite side of the dielectric system;
wherein the shape of the periodic dielectric structure is a square, a hexagon, or any shape convenient for manufacturing.

According to the invention, an interconnection system comprises:
 (i) single or multiple electrical conductors (signal lines hereinafter) for carrying one or more electrical signals from one electronic element to another for electrical communication;
 (ii) a dielectric system designed to handle a desired signal frequency, comprising a dielectric medium having periodic arrays of dielectric spheres or cylinders with certain predetermined diameter and pitch, located outside and underneath the electrical signal lines;
 (iii) a ground and/or a power line located on the opposite side of the dielectric system;
wherein the shape of the periodic dielectric structure is a square, a hexagon, or any shape convenient for manufacturing.

According to the invention, an interconnection system comprises:
 (i) single or multiple electrical conductors ("signal" lines hereinafter) for carrying one or more electrical signals from one electronic element to another for electrical communication;
 (ii) a dielectric system designed to handle a desired signal frequency, comprising a dielectric medium having periodic arrays of dielectric spheres or cylinders with certain predetermined diameter and pitch, located outside the electrical signal lines;
 (iii) a ground and/or a power line located on the opposite side of the dielectric system;
 (iv) a second dielectric system to cover the electrical signal lines;
wherein the shape of the periodic dielectric structure is a square, a hexagon, or any shape convenient for manufacturing.

According to this invention, the dielectric system comprises periodic arrays of air holes with certain predetermined diameter and pitch formed in a dielectric medium, and located outside of the electrical conductors.

According to this invention, the dielectric system comprises periodic arrays of air holes with certain predetermined diameter and pitch formed in a dielectric medium, located outside of the electrical conductors, and the holes are filled with liquid crystal, wherein the dielectric constant inside the holes change in response to an electrical field, resulting in a tunable effective dielectric constant.

According to the invention, the dielectric system is based on a photonic crystal system, an electronic crystal system, a quasi-photonic crystal system, or a quasi-electronic crystal system, comprising periodic arrays of the dielectric sphere or cylinder with predetermined diameter and lattice constant, wherein the electromagnetic wave is propagated inhomogeneously, but is not dissipated in the dielectric media.

According to this invention, the dielectric system is designed on the principle of a photonic or an electronic bandgap.

According to this invention, the electrical signal line is a microstrip line, a strip-line, or a coplanar waveguide type transmission line.

According to this invention, the interconnection bandwidth is increased due to reduced microwave-loss and signal propagation constant by using a dielectric system having low effective dielectric constant and low effective dielectric loss tangent. Reduction in the microwave-loss results in achieving a speed of electromagnetic waves within the electrical signal line to be closer to the speed of light.

One aspect of the invention teaches a cost effective method that is compatible with current IC and PCB manufacturing technologies for constructing high bandwidth on-chip and off-chip interconnections, for connecting one electronic element to another electronic element using a high bandwidth electrical signal line, without sacrificing their individual signal speed.

Another advantage of this invention is that conventional IC fabrication technology for on-chip interconnection, conventional PCB technology for off-chip interconnection, and conventional manufacturing technologies are available for connector and cable manufacturing.

Another object of this invention is to minimize the skew in the signal interconnection due to the signal propagation delay by reducing the microwave loss.

Other objects, features, and advantages of the present invention will be apparent from the accompanying claims, to be read in view of drawings and the detailed description that follows.

BRIEF DESCRIPTION OF THE DRAWINGS

The invention will be explained in more detail in conjunction with the appended drawings, wherein

FIGS. 2A, 2B, and 2C are top and, front and side cross-sectional views, respectively, of a prior art inter-chip (off-chip) electrical interconnection;

FIGS. 5A and 5B are simplified cross-sectional views of microstrip line and strip-line types of transmission lines, respectively. This is an explanatory diagram showing a prior-art interconnection;

FIGS. 6A and 6B are top and cross-sectional views, respectively, showing the electrical field distribution in a microstrip line type transmission line. This is an explanatory diagram showing the prior-art interconnection;

FIGS. 7A and 7B are frequency responses (S11 and S21) of microstrip line and strip-line types of transmission lines, respectively. This is an explanatory diagram showing the prior-art interconnection;

FIG. 8A is a top view, and FIGS. 8B and 8C are cross-sectional views along the line AA' shown in FIG. 8A, illustrating a microstrip line type transmission line on a dielectric system for electronic interconnection in a first preferred embodiment of the invention;

FIG. 10A is a top view, and FIGS. 10B, 10C and 10D are cross-sectional views along the line AA' shown in FIG. 10A, illustrating a microstrip line type transmission line on a dielectric system having backside slots and a periodic dielectric structure, in a second preferred embodiment of the invention;

FIGS. 11A and 11B are cross-sectional views illustrating microstrip line type transmission line on a dielectric system consisting of an array of air spheres or cylinders having a diameter D and a span b, based on a photonic crystal system or an electronic crystal system in a third preferred embodiment of the invention. The insets show examples of the circular cell shape arranged in a triangular lattice (FIG. 11A) and a square lattice (FIG. 11B);

FIG. 14B is depicted along the line AA' shown in FIG. 14A;

FIG. 15B is depicted along the line AA' shown in FIG. 15A. The difference in FIGS. 14A & 14B is that the periodic dielectric structure is extended under the signal line;

FIGS. 18A, 18B, and 18C show enlarged cross-sectional views of a 2-layer stacked PCB, illustrating inter-chip interconnections on a periodic dielectric structure in a ninth preferred embodiment of the invention;

FIG. 19A is a top view and FIGS. 19B and 19C are side and front cross-sectional views, respectively, along the lines AA' and BB' shown in FIG. 19A, illustrating inter-chip (off-chip) interconnections consisting of the multilayered PCB in a tenth preferred embodiment of the invention;

DETAILED DESCRIPTION OF THE INVENTION

Figure 1:
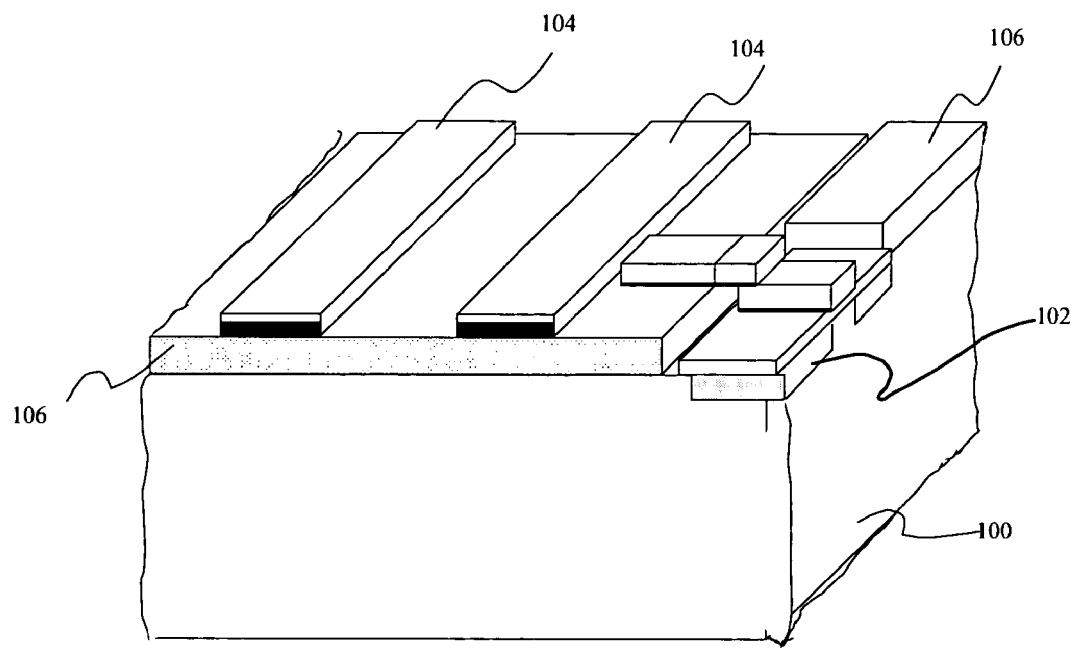
FIG. 1 is a cross-sectional view showing a prior art intra-chip (on-chip) electrical interconnection. For simplicity, MOS-transistors and their electrical interconnections are shown.
Figures 3, 4:
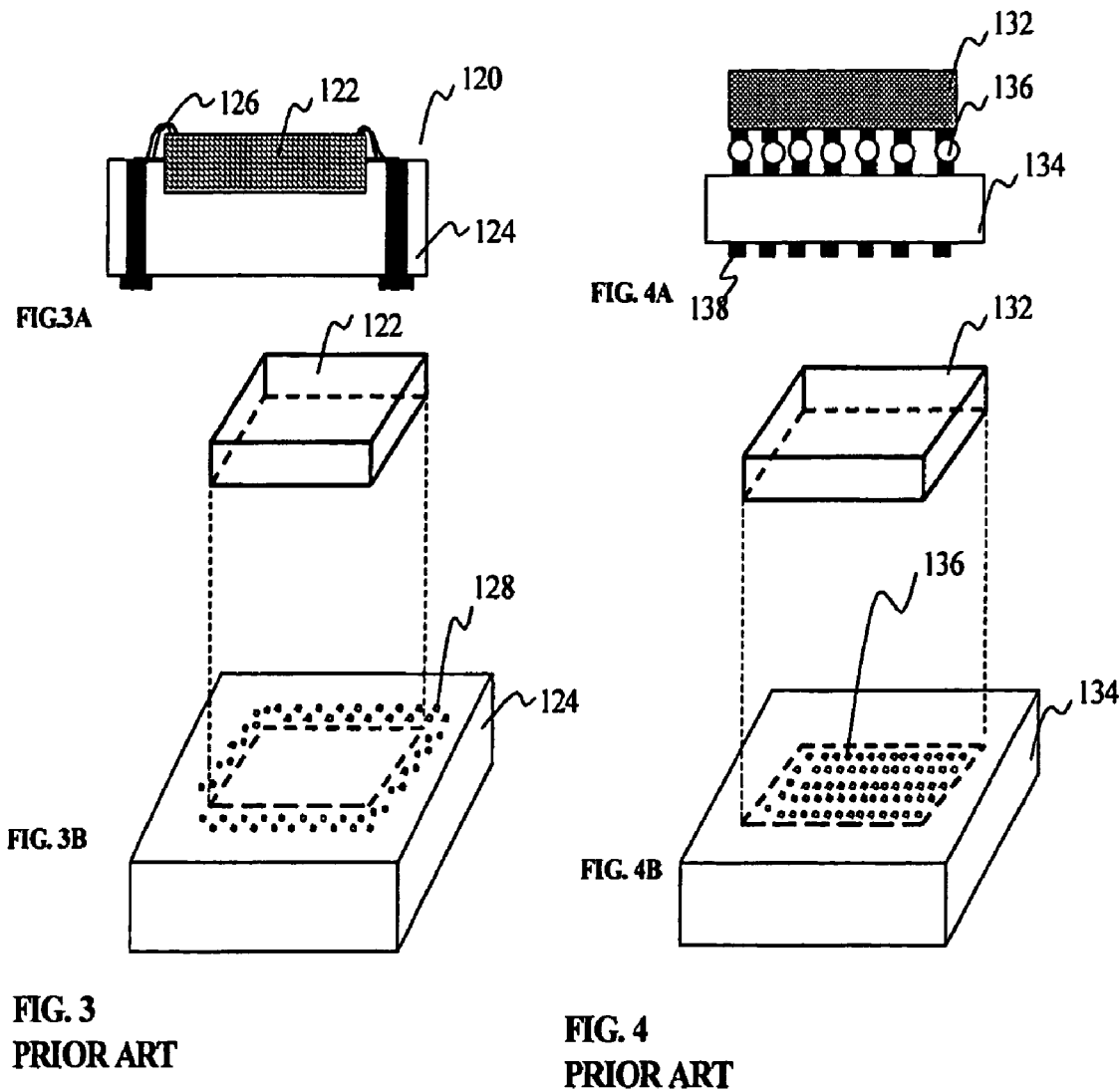
FIGS. 3A and 3B are top and cross-sectional views, respectively, showing a BGA-chip package for a high-speed die package. This is an explanatory diagram showing the chip package shown in FIGS. 2A, 2B, and 2C.
FIGS. 4A and 4B are top and cross-sectional views, respectively, showing a CSP-chip package for a high-speed die package. This is an explanatory diagram showing the chip package shown in FIGS. 2A, 2B and 2C.

The best modes for practicing the present invention will be described in turn with reference to the accompanying drawings. In the following description, the same reference numerals denote components having substantially the same functions and arrangements, and duplicate explanations will be made only where necessary.

An important aspect of a high speed electronic interconnection according to a first embodiment is that the microwave loss is reduced by reducing the effective dielectric constant, resulting in increased bandwidth of the interconnection, thereby reaching a signal speed in the interconnection that approaches closer to the source signal speed. According to a second important aspect of the invention, the technique is cost effective and compatible with standard manufacturing technologies known in the art.

In an on-chip interconnection between two or more interconnected electronic elements (such as transistors, ICs, etc.), an electrical signal at a low speed can be communicated through an electrical signal conductor in form of a wire laid on a dielectric medium. However, for communicating an electrical signal at a high-speed, an electrical signal conductor must be a microstrip line type, or a strip line type transmission line.

In the following sections, preferred embodiments of the invention will be disclosed, wherein first a method(s) to reduce effective dielectric constant will be discussed, and later the method(s) as applied to preferred embodiments will be presented.

FIGS. 8A, 8B, and 8C collectively represent a first embodiment of an interconnection according to the principles of the invention, wherein FIG. 8A is a top view of the interconnection and FIGS. 8B and 8C are cross-sectional views of the interconnection along a line AA' shown in FIG. 8A. More specifically, FIG. 8A shows a microstrip line type signal line 140A for carrying an electrical signal, laid on a dielectric system having a periodic dielectric structure 148, consisting of an array 150 of dielectric spheres or cylinders (also referred as a periodic dielectric array in the rest of the application) with a diameter $2r$ (FIG. 8C) and a span a (FIG. 8A), and a second dielectric medium 152 (FIGS. 8B, 8C). The combination of elements described above will be collectively referred as an interconnection system in this application. The values $2r$, $a$, and an operating frequency are carefully selected, such that the electrical field 154 is localized near the signal line, thereby preventing the electrical field 154 from spreading away from the signal line. The periodic dielectric array effectively reduces the dielectric constant and localizes the electric field near the signal line. As a result the microwave loss is substantially reduced. In other words, as compared to a conventional interconnection shown in the prior art example of FIG. 6, wherein a signal line is laid on to a uniform layer of a dielectric medium, the signal transmission in the interconnection according to the present invention shown in FIG. 8A is less dispersive, and thereby a higher bandwidth of the interconnection system is achieved. Since the electric field is localized near the signal line less cross talk is expected. As shown in FIGS. 8B and 8C, the dielectric medium underlying the signal line may be chosen to be a uniform layer of a dielectric material 156 (FIG. 8B), or a periodic dielectric array 158 (FIG. 8C).

As a design choice, the periodic dielectric array as shown in FIGS. 8A, 8B, and 8C, may be an array of air holes or any other material having a lower dielectric constant than the surrounding dielectric media. In the exemplary embodiment, although a single signal line is shown, the present invention will be applicable equally well to other types of signal lines such as, a strip-line type transmission line, single and multi electrodes, and a coplanar waveguide configuration.

Figure 9:
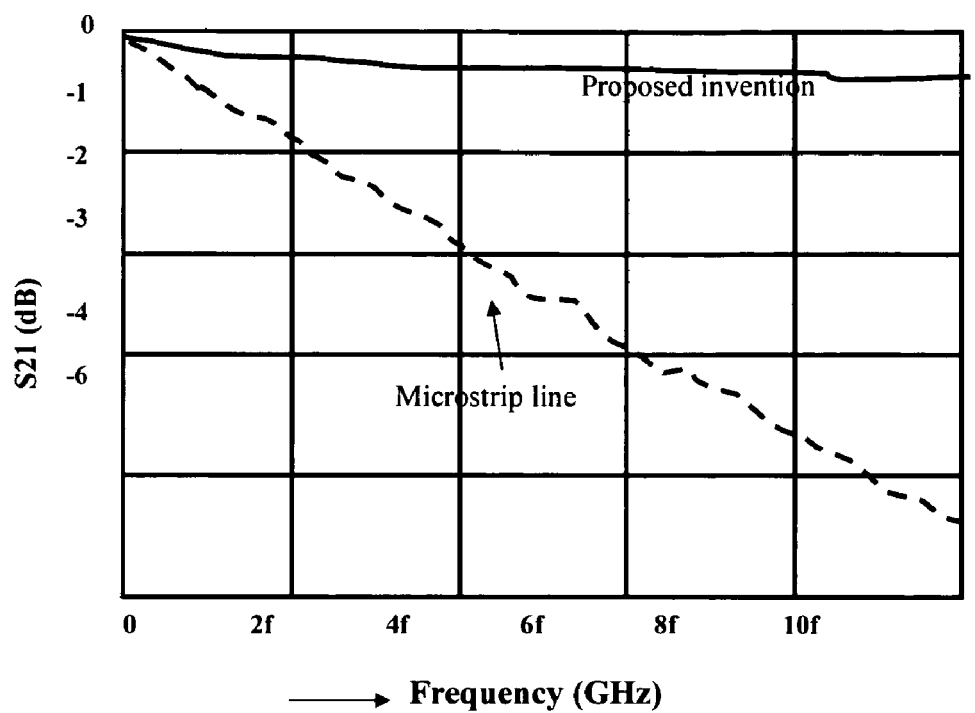
FIG. 9 is a frequency response (S21) comparing a microstrip line type transmission line on a uniform layer of dielectric medium, and a microstrip line type transmission line on a dielectric system having a periodic dielectric structure

In FIG. 9 frequency responses of the microstrip line type transmission lines of the example shown in the prior art FIG. 6 and the exemplary embodiment shown in FIG. 8, respectively, are compared. Due to a reduction in the microwave loss, the frequency response of the interconnection system according to the principles of the invention is substantially improved as compared to the prior art microstrip line type interconnection.

FIGS. 10A, 10B, 10C, and 10D collectively represent a second embodiment of the invention, wherein to avoid repeated explanation, like parts are indicated by like reference numerals as used in FIG. 8. More specifically, FIG. 10A is a top view of an interconnection and FIGS. 10B, 10C, and 10D are the enlarged cross-sectional views of an interconnection system along the line AA' shown in FIG. 10A. In FIGS. 10A, 10B, 10C, and 10D, the microstrip line type of transmission line consisting of signal lines 140C, 140D, and 140E and back-side ground lines 144C, 144D, and 144E, laid on to a periodic dielectric structure 168 consisting of dielectric spheres or cylinders 150, with diameter 2$r$ (FIG. 10D) and span a (FIG. 10A), similar to the periodic dielectric array described earlier in reference with FIGS. 8A-C, and a backside slot 164. According to principles of the invention, the effective dielectric constant (i.e. microwave index) is substantially reduced, and the electrical field intensity 170 (FIG. 10A) near the signal lines is increased, and localized.

FIGS. 11A and 11B are the enlarged cross-sectional views of an interconnection system, in a third preferred embodiment in accordance with the present invention, wherein like parts are indicated by like reference numerals as used in FIGS. 8 and 10 so that a repeated explanation is omitted here. More specifically, FIGS. 11A and 11B, each show a microstrip line type transmission line consisting of a signal line 140F and a backside ground line 144F laid on a periodic dielectric structure 172A (for FIG. 11A) and 172B (for FIG. 11B), respectively, consisting of spheres or cylinders 174 with diameter D and span b, similar to the periodic dielectric array described earlier in reference with FIGS. 8 and 10. Each cylinder constitutes a cell 174 (to be referred as a circular cell hereinafter. Each circular cell 174 is arranged in a triangular array 176, or a square array 178, shown in insets 180 and 182 of FIGS. 11A and 11B, respectively. The arrangement of the cells forms a lattice. According to the principles of the invention, the circular cells 174 formed inside a dielectric material having a higher dielectric constant, contains air which has a lower dielectric constant. The electric field from the signal line passes through the air cell or air hole 174, thereby reducing the effective dielectric constant and increasing the bandwidth of the interconnection. The parameters such as diameter D and span b are carefully selected, such that the electrical field distribution away from the signal line is optimized to further increase the interconnection bandwidth. Those skilled in the art will appreciate that the circular cells 174 arranged in triangular or square lattice structure shown in the preferred embodiment of FIGS. 11A and 11B, may be replaced by elliptic cells arranged in triangular or square lattice structure without deviating from the principles of the invention. Advantageously, the geometrical parameters of the elliptical cells (lengths of the major and minor axes) may be additionally selected to further control the proportion of the electrical field passing through the air and through the dielectric material surrounding the elliptical cells. In this case also, the effective dielectric constant ($\in_{\mathit{eff}}$) of the interconnection system is reduced. This adds many features in the interconnection system such as variable phase velocity (which is function of $\in_{\mathit{eff}}$) and variable bandwidth of the interconnection. Additionally, it helps in adjusting signal skews within the single signal line of the interconnection system.

According to the preferred embodiment, ideally, the electrical signal speed inside the interconnection system can approach closer to the speed of light, provided other losses related to the signal line structure, such as signal line electrode parameters (resistance, capacitance) are neglected.

Figure 12:
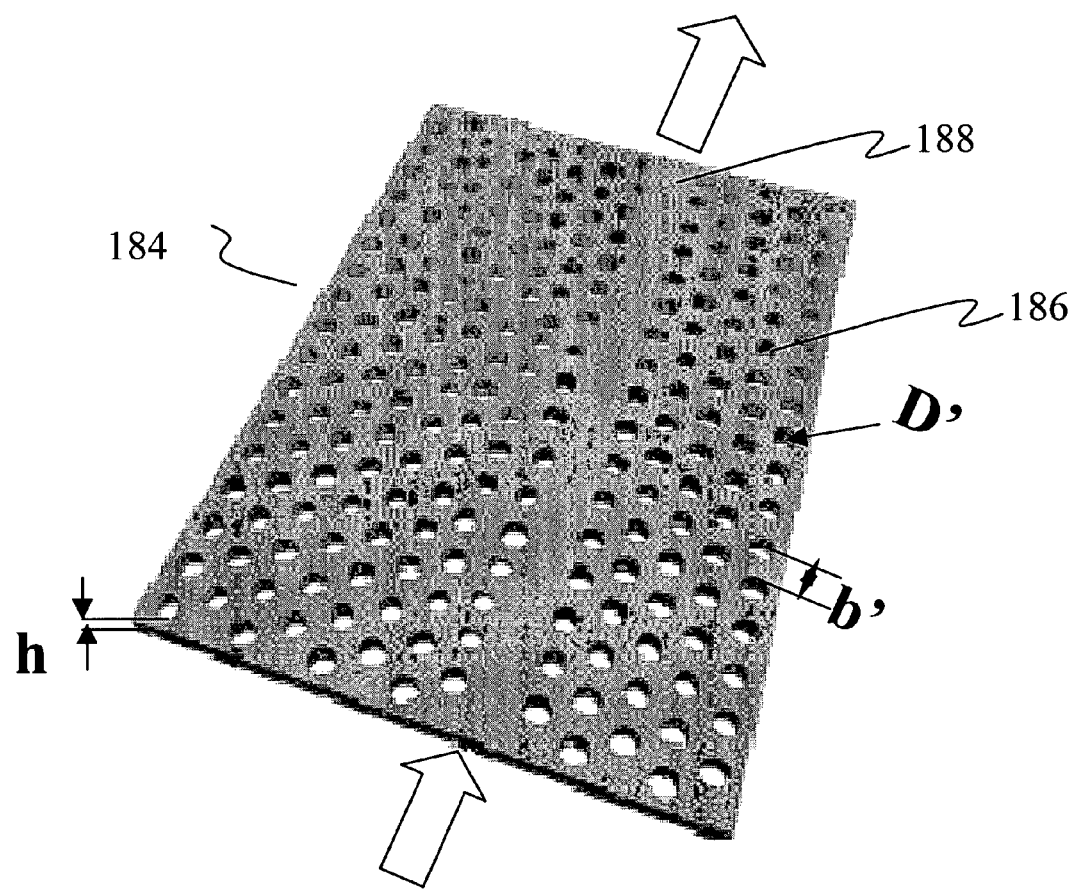
FIG. 12 shows the cross-sectional view of a 2D (2-dimensional) photonic crystal with circular air holes in a dielectric substrate and a line defect for a signal line in a fourth embodiment of the invention.

The periodic dielectric structure described in the preferred embodiments may also include a photonic crystal structure (2D and 3D) within the periodic dielectric structure and a line defect for the signal line layout. A band-gap is formed due to cylinders of a lower dielectric constant material formed inside a substrate having a relatively higher dielectric constant. FIG. 12 is the cross-sectional view of a periodic dielectric structure comprising 2D photonic crystals for a high-speed interconnection system in a fourth preferred embodiment according to the present invention. The periodic dielectric structure comprises a photonic crystal 184, consisting of air spheres or cylinders 186 with diameter D', height h, and span b', in a dielectric substrate, and a line defect 188 on which a signal line is laid. In this structure, the electrical field created from the high-speed signal flows through the signal line (not shown) is confined and controlled in the signal-line direction denoted by arrows, by the 2D photonic band gap effect. The electrical field may be completely localized in the air holes along the direction of the signal flow, resulting in a low effective dielectric constant (low microwave loss), thereby increasing the bandwidth of the interconnection system. By changing the shape of the cylinder, for example to an ellipse, and its size and span, the electrical field may be localized in a region having a relatively higher effective dielectric constant (and higher microwave loss) and the bandwidth of the interconnection reduces. This allows the interconnection systems, to have different bandwidths and the signals therein, to be of a low-speed or a high-speed when required. According to the preferred embodiment, the interconnection can ideally be designed to have a bandwidth substantially close to the bandwidth of an optical fiber so that it can carry the high-speed electronics signal (even at terahertz frequency). In the example, the periodic dielectric structure is shown to be comprising a 2D photonic crystal. The present invention also includes the 3D photonic crystal for high-speed interconnection systems, applicable in the on-chip and off-chip interconnections. This also includes the means, such as the connector and cable, used for high-speed connection of electronic elements including transistors.

The interconnection systems described in the preferred embodiments, can be fabricated as follows: first, a layer of cylindrical holes is made in a dielectric substrate using one of many methods known in the art. Such methods may for example include IC fabrication technology for on-chip interconnections and PCB technology for off-chip interconnections. This is followed by the formation of a signal line. The holes can be made underneath the signal line or the area underneath the signal line may be masked while opening the holes outside the signal line. Alternatively, a material with a lower dielectric constant can fill up the holes rather than the dielectric substrate material.

Figure 13:
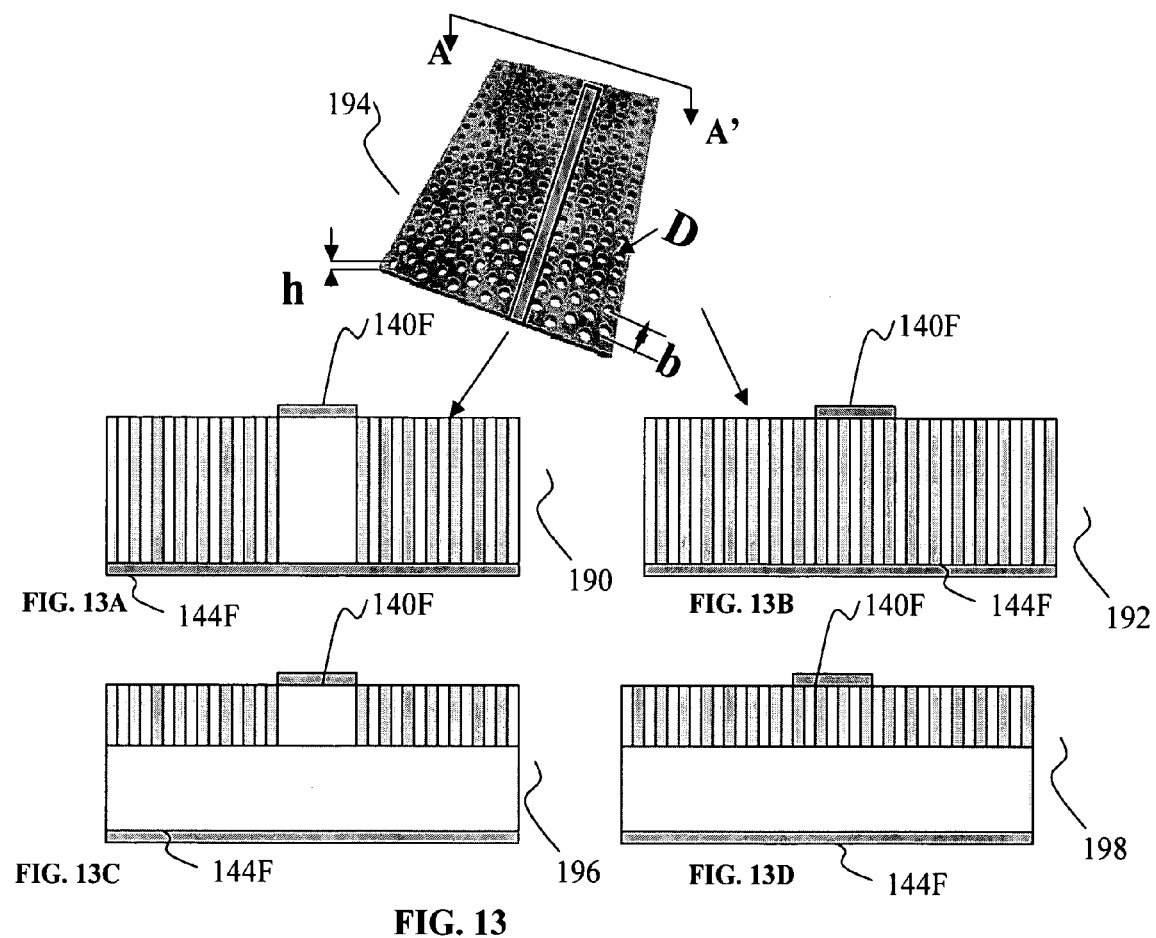
FIGS. 13A, 13B, 13C, and 13D are cross-sectional views illustrating a microstrip line type transmission line on different combinations of multiple dielectric system shown in FIGS. 8A-8C, 11A-11B, and 12, in a fifth preferred embodiment of the invention. The hole can be filled with air or any other dielectric material.

FIGS. 13A, 13B, 13C, and 13D are the cross-sectional views of portions of an interconnection system, in a fifth preferred embodiment in accordance with the present invention, wherein like parts are indicated by like reference numerals as used in FIGS. 11 and 12 so that repeated explanation is omitted here. The interconnection system comprising a microstrip line type signal line 140F and a ground line 144F as a part of the interconnection is shown therein. In FIGS. 13A and 13B, a periodic dielectric structure comprises single layers of periodic structure 190 and 192, as described in FIG. 11. The difference between FIGS. 13A and 13B is that the air holes under the electrical signal line are absent in FIG. 13A, and the air holes are present in FIG. 13B. The inset 194 of FIG. 13 shows an exemplary schematic of a periodic dielectric structure with circular cells arranged in a triangular-lattice structure. As shown in FIGS. 13C and 13D, periodic dielectric structures 196 and 198 shown therein comprise two layers of dielectrics materials: (a) one having a periodic dielectric structure, and (b) the other having a uniform dielectric constant located under the periodic dielectric structure. The periodic dielectric structures, mentioned in FIGS. 13A, 13B, 13C, and 13D are substantially similar to those explained in FIGS. 11 and 12, so that related explanation is omitted here.

Broadband interconnections may be designed by using one or more dielectric layer combinations of photonic crystals and homogeneous dielectric layers. For simplicity, we have shown two layers, however, the present invention also includes interconnection systems with more than two layers having the periodic dielectric structure wherein having a periodic dielectric structure in the inner most dielectric layer contributes to the broadband of the interconnection system the most. In the preferred embodiments, described above in conjunction with FIGS. 8A-8C, 9, 10A-10D, 11A-11D, 12 and 13A-13D, single microstrip line type signal lines in different configurations are shown to explain the object of the invention. Those skilled in the art will appreciate that these embodiments are only exemplary, and do not exclude other types of transmission lines known in the art, such as single or multiple signal lines in strip-line and coplanar waveguide configurations. Advantageously, signal lines in these cases could be single or differential lines.

In the preferred embodiments described earlier, such dielectric materials include a wide range of materials known to those skilled in the art, and sold under different trade names. For example, ceramic materials such as Duroid™, FR4, AlN, $Al_2O_3$, Mullite ($3Al_2O_3$: $2SiO_2$), $SiO_2$, Silicon nitride, silicon carbide, Silicon-Oxy-Nitride, BeO, Cordierite (magnesium alumina silicate), BN, glass (with different compositions), epoxy glass, CaO, MnO, ZrO2, PbO, alkali-halide (e.g. NaBr, NaCl) BN, BeO, etc., and different types of polyimides and benzocyclobutenes (BCBs) having desirable dielectric properties are equally applicable. Other polymeric dielectric materials also include, but are not limited to, TEFLON™, liquid crystal polymer, epoxy, parylene, silicone-polyimide, silicone-gel, fluorinated ethylene propylene copolymer. It also includes elastomers (e.g. silicone elastomer), monomers, and gels. Dielectric materials which can be made using high temperature ceramics processing or IC fabrication processing, also are included in this category. All standard polymers can be available from the standard manufacturers for example, DuPont™, Hitachi-Chemical™, Mitsui™, and Mitsubishi-Chemical Industries™. The liquid crystal polymer is marketed by Gore-Tex™, of Japan.

In reference with the preferred embodiments shown in FIGS. 8A-8C, 10A-10D, 11A-11D, 12 and 13A-13D, the periodic dielectric structures comprising air holes or arrays of spheres or cylinders in the dielectric substrate are described. The spheres in these examples may be made from any dielectric material having a lower dielectric constant than the dielectric substrate. Alternatively, the air holes may be filled with a material having a lower dielectric constant than the dielectric constant of the substrate material. Alternatively, in the preferred embodiment, the air holes can be filled fully or coated with liquid crystal. In this case the electrical field changes the orientation of the liquid crystals and controls the effective dielectric constant of the periodic dielectric structures. In the preferred embodiments as explained in FIGS. 10A, 10B, 10C, and 10D, a dielectric material having a dielectric constant lower than the dielectric substrate or a liquid crystal polymer material may be filled in the backside slotted portion to effectively provide tunability to the effective dielectric constant of the periodic dielectric structures.

According to the present invention, preferred embodiments described earlier may be implemented in applications, including but not limited to (a) on-chip interconnections, for example, for connecting two or more electronic devices and/or connecting electrical and optical devices, (b) off-chip interconnections, for example, connecting two or more electronics chips on a circuit board, (c) high-speed chip (die) packaging, (d) high-speed electrical cable for connecting multiple electrical modules for example, board-to-board interconnection, rack-to-rack interconnection, etc., and (e) high-speed connectors, used as interface means to connect high-speed electronics elements.

Some of the different applications of the exemplary interconnection system and their fabrication method(s) are described in the following sections. These examples are only representative and are not limited to the specific description provided.

On-Chip Interconnection:

FIG. 14A shows a cross-sectional view of a portion of an on-chip interconnection system in a sixth preferred embodiment of the present invention, wherein like parts are indicated by like reference numerals, so that a repeated explanation is omitted here. FIG. 14B is a cross-sectional view along the line AA' shown in FIG. 14A. In this example a MOS (metal-oxide semiconductor) device 224 (FIG. 14A) constructed on a semiconductor substrate 226 (e.g. silicon, FIG. 14A) is connected with other electronic devices (not shown) by a signal line 228A (FIG. 14A). A plurality of other electronic devices (not shown) on the semiconductor substrate 226 (FIG. 14A) can be interconnected by signal lines 228A (FIG. 14A) and 228B (FIG. 14B). The signal lines 228A (FIG. 14A) and 228B (FIG. 14B) are made on the periodic dielectric structure 230 (FIG. 14A) comprising an array of air holes (spheres or cylinders) 232 (FIG. 14A), with predetermined diameter and span, into a dielectric layer 234 (FIG. 14A). The portion of the dielectric layer 236A (FIG. 14A) and 236B (FIG. 14B) over which the signal line 228A (FIG. 14A) and 228B (FIG. 14A) is laid is uniform (without the air holes). A layer (not shown) of the dielectric material used to construct the periodic dielectric structure 230 (FIG. 14A) covers the top of the interconnection.

In the exemplary periodic dielectric structure 230 shown in FIGS. 14A and 14B, the dielectric layer 234 (FIG. 14A) is deposited using a standard IC fabrication process including, chemical vapor deposition (CVD), sputtering, or evaporation. After making patterns using any standard photolithography technology, the holes 232 (FIG. 14A) are formed in the dielectric layer 234 (FIG. 14A) using a dry-etching (or wet-etching) technology, such as reactive ion beam etching (RIBE), reactive ion etching (RIE), milling, etc. Subsequent patterning and metallization using a lift-off technique is used to make the signal lines which connect the electronic devices on-chip.

Figure 14:
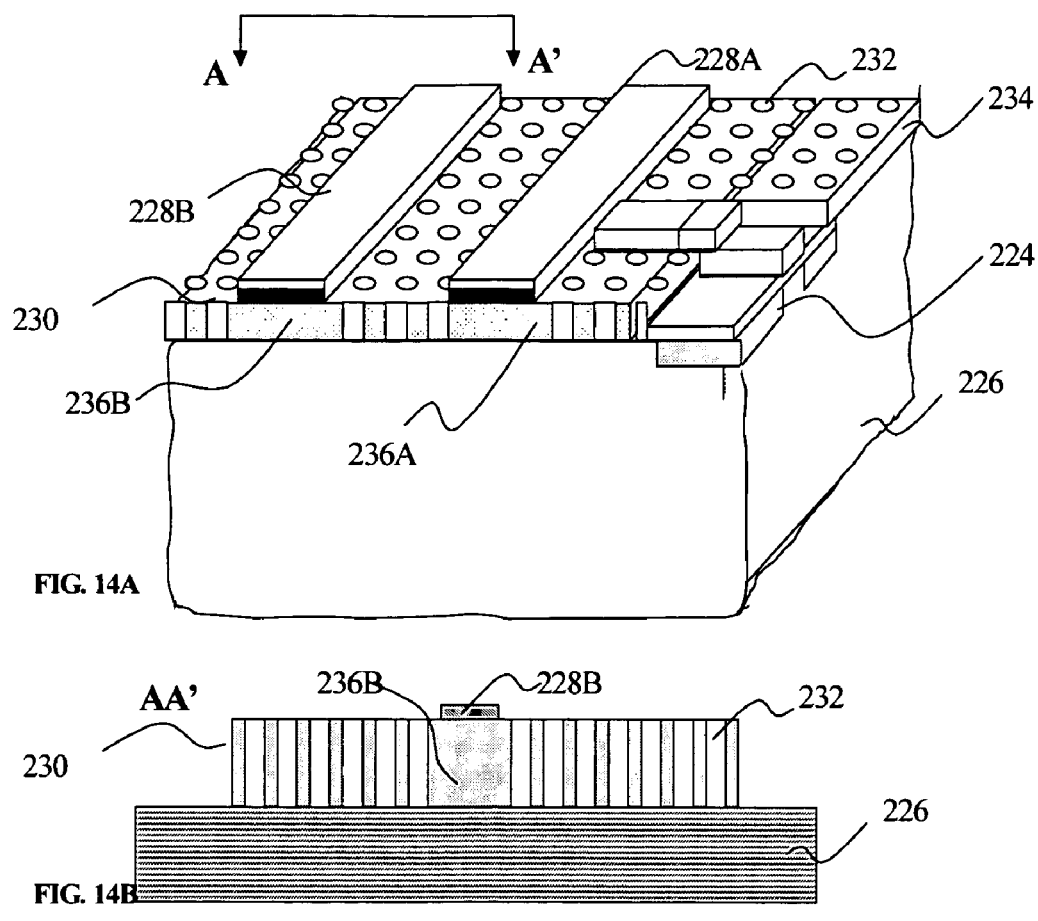
FIGS. 14A and 14B are cross-sectional views illustrating an on-chip (intra-chip) interconnection wherein a signal line is laid on a periodic dielectric structure, in a sixth preferred embodiment of the invention.
Figure 15:
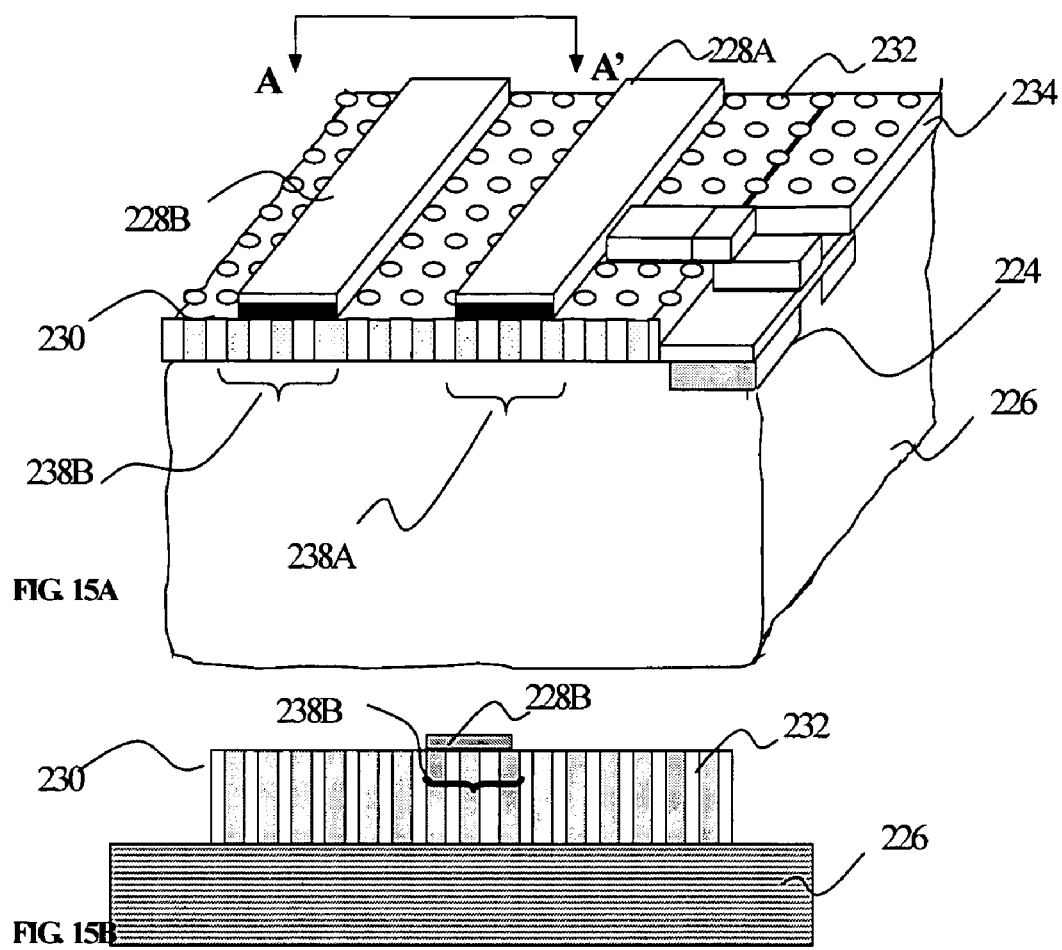
FIGS. 15A and 15B are cross-sectional views illustrating an on-chip (intra-chip) interconnection wherein a signal line is located on a periodic dielectric structure, in a seventh preferred embodiment of the invention.

FIG. 15A shows a cross-sectional view of a portion of the on-chip interconnection system in a seventh preferred embodiment of the present invention, wherein like parts are indicated by like reference numerals used in FIG. 14, so a repeated explanation is omitted here. FIG. 15B is a cross-section view along the line AA' shown in FIG. 15A. In this exemplary embodiment, a MOS (metal-oxide semiconductor)-device 224 (FIG. 15A) on a semiconductor substrate 226 (e.g. silicon FIG. 15A) is connected to another electronic device (not shown) by signal line 238A (FIG. 15A). A plurality of other electronic devices on semiconductor substrate 226 (FIG. 15A) can be interconnected by signal lines 238A (FIG. 15A) and 238B (FIG. 15B). The signal line 228A (FIG. 15A) and also 228B (FIG. 15B) is laid on the periodic dielectric structure 230 (FIG. 15A) comprising an array of air hole (spheres or cylinder) 232 with predetermined diameter and span in a dielectric layer 234 (FIG. 15A). The difference between FIG. 14 and FIG. 15 is that the uniform layers of dielectric material 236A (and 236B) in FIG. 14A (and FIG. 14B) under the signal lines (for example 228A and 228B in FIGS. 14A and 14B) is replaced by the periodic dielectric structure 238A and 238B in FIGS. 15A and 15B (i.e. air hole array). A layer (not shown) of the dielectric material used to construct the periodic dielectric structure 230 (FIG. 15A) covers the top of the interconnection. The periodic dielectric structure and signal lines are constructed following substantially the same method as described earlier in reference with FIGS. 14A and 14B.

Figure 16:
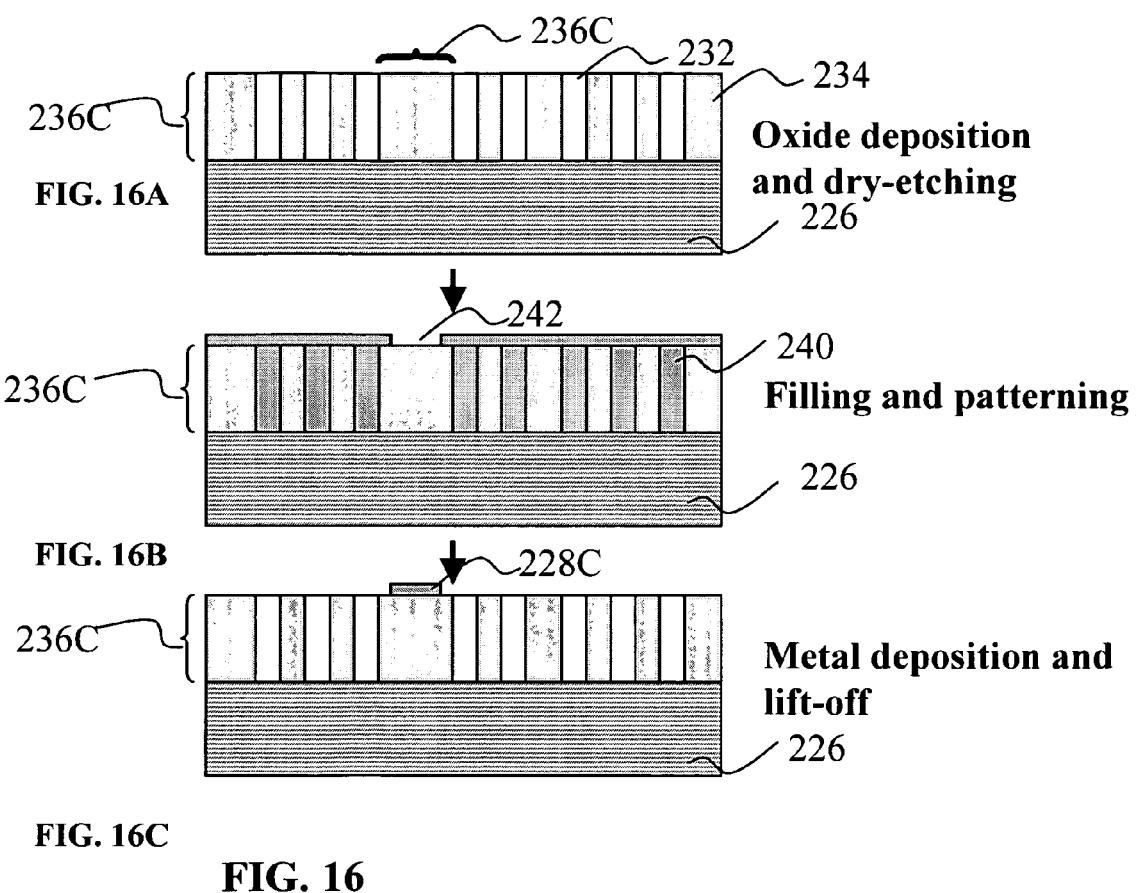
FIGS. 16A, 16B, and 16C show enlarged cross-sectional views of a preferred on-chip interconnection fabrication process according to the principles of the invention.

Cross-sectional views showing a portion of an on-chip interconnection in FIGS. 16A, 16B, and 16C outline a preferred fabrication processes in accordance with the present invention, wherein like parts are indicated by like reference numerals as used in FIGS. 14 and 15, so that repeated explanation is omitted here. For simplicity, a single layer and a single line interconnection is shown. Substantially similar techniques may be used for fabricating large scale on-chip interconnection systems as well. Following the oxide deposition and subsequent dry-etching steps using IC fabrication technologies such as RIE, RIBE, or ion-milling etc. air holes 232 (FIG. 16A) are opened into a dielectric layer 234 (FIG. 16A), except in a portion 236C (FIG. 16A) over which a signal line 228C (FIG. 16C) will be laid in a later step. The air holes are filled with a polymer material 240 (FIG. 16B). After having a pattern for opening 242 (FIG. 16B) for the signal line, metallization for 228C (FIG. 16C) is formed using a lift-off technique. Thus, the dielectric portion 236C (FIGS. 16A-16C) over which signal line 228C (FIG. 16C) is laid on is kept without the air holes.

According to other preferred embodiments, on-chip interconnection systems may be constructed using one or more periodic dielectric structures (for reducing the microwave loss), as explained earlier in reference with FIGS. 8A-8C, 9, 10A-10D, 11A-11B, 12, and 13A-13D. For example, air hole arrays can be used in the periodic dielectric structure. Alternatively, the air holes may be filled with a low dielectric constant material or a liquid crystal polymer. For example such low dielectric constant materials include but are not limited to, vapor deposited silicon oxide, silicon nitride, silicon oxynitride, silicon carbide etc. Microporous silicon can also be used as dielectric layer 234. Other dielectric materials may also include but are not limited to, vapor deposited or spin-coated polymers such as benzocyclobutene, acrylate based polymer, elastomer or monomer etc. In the preferred embodiments, described in reference with FIGS. 14A-B, 15A-B and 16A-16C, microstrip line type transmission line is considered for the signal line, however, the principles outline in these examples are applicable equally to other types of signal lines including strip-line, coplanar waveguide lines single or multiple signal lines (as single or differential). The signal lines may be additionally covered on top with a layer of (not shown) of the same or different dielectric material as the ones used in the periodic dielectric structure.

Off-Chip Interconnections:

The principles of the on-chip interconnection system described earlier in reference with FIGS. 8A-8C, 9, 10A-10D, 11A-11B, 12, and 13A-13D, are also applicable for multiple chip interconnections on a circuit board (off-chip). The circuit board may be made from FR4 material or any other dielectric material as mentioned previously.

Figure 17:
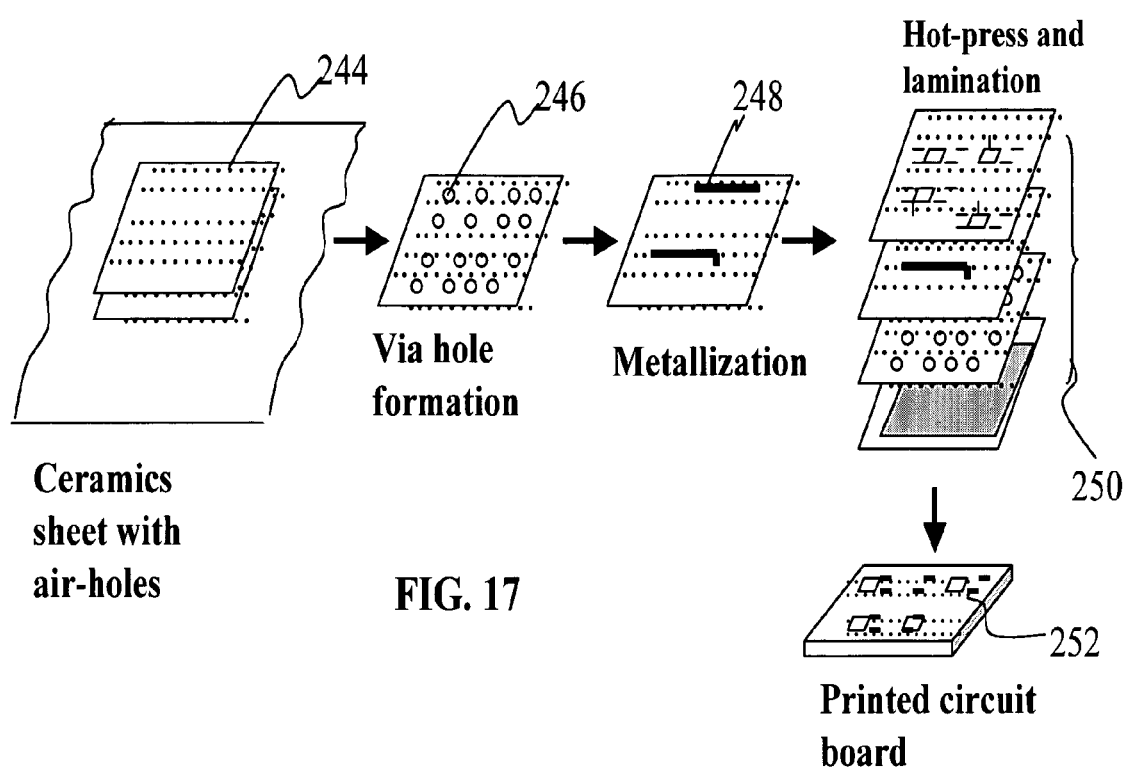
FIG. 17 is a schematic illustrating a preferred fabrication process of a PCB having a periodic dielectric structure in an eighth preferred embodiment according to the principles of the invention.

FIG. 17 shows a flow-chart of a printed circuit board (PCB) fabrication process for an off-chip interconnections system in an eighth embodiment in accordance with the principles of the invention, wherein like parts are indicated by like numerals, so that repeated explanation is omitted here. A dielectric sheet (not shown) is made using a standard PCB technology, for example a slurry casting process in which the slurry is cast into about 200 μm to 500 μm thick ceramic sheets by a slip cast process. To make the preorder dielectric structure 244, arrays of air holes are made into the dielectric substrate using processes such as laser drilling, dry-etching, or wet-etching (following patterning for etching). Via holes are formed through the dielectric sheet with air holes 244 by a punching machine with punches and dies. For example, ceramic sheet 244 may have more than 10,000 via holes in a 250 mm square area. A low resistivity conductor paste is applied onto the punch sheet. In this step, via holes are filled with the paste to form the contacts between signal lines to be formed later. As the dielectric system have air holes, additional processes may be necessary to fill the air holes and via holes which are then followed by wet etching to take the excess filler out. The low resistivity conductor material may be the one selected from a group consisting of silver-palladium, gold, molybdenum, and tungsten refractory material. The sheets are then sintered at high temperature, which results in low electrical resistivity. Metallization sheet 248 is made using a conventional PCB technology.

Two or more of such metallized sheets 248 are precisely stacked in a pressing die in sequence by a stacking machine. These sheets 250 are laminated together by a hot press. Density heterogeneities in the laminated samples influence any shrinkage in the sintered substrate. Therefore, this lamination process is homogenously carried out by means of a correct dimensional die and punch with flat surfaces. Burn out and sintering processes for the multilayered PCB board 252 may be necessary after lamination at the temperature suitable to ceramic material used as the sheet.

FIGS. 18A, 18B, and 18C are the cross-sectional views of two layers of ceramic sheets having the periodic dielectric structure described earlier in reference with FIGS. 8A-8C, 9, 10A-10D, 11A-11B, 12, and 13A-13D, in a ninth embodiment, wherein the like parts are indicated by the like numerals so that repeated explanations are omitted here. The metallization, stacking, and lamination are carried out using the steps described in reference with FIG. 17.

FIG. 19A is a top view and FIGS. 19B and 19C are cross-sectional views along the lines AA' and BB', respectively, shown in FIG. 19A in a tenth preferred embodiment, wherein like parts are indicated by like numerals, so that similar explanations are omitted here. As an example, an interconnection between two chips, a CPU processor 120 and a memory device 130, is shown. For simplicity, only enlarged portions of the cross-sectional views of high speed chips (e.g. the processor and the memory) interconnection is shown. Complete PCB with lower speed chips interconnection is not shown. Shown in this example is a high speed signal line 254 connected on the top layer of the PCB whereas a low speed signal line (not shown) may be connected at the lower layer of the PCB. This arrangement will reduce any possibility of discontinuities, which may arise at the via holes. A high interconnection bandwidth is achieved using the technique described previously thereby individual signal speed of the chips 120 and 130 are preserved. In the preferred embodiment shown in FIGS. 19A, 19B, and 19C, as a design choice, either the whole portion of the PCB comprises the periodic dielectric structure or only the portion where the high speed chips are connected, has the periodic dielectric structure, whereas the areas of the PCB where low speed chips are connected has a material having a uniform dielectric constant.

Figure 20:
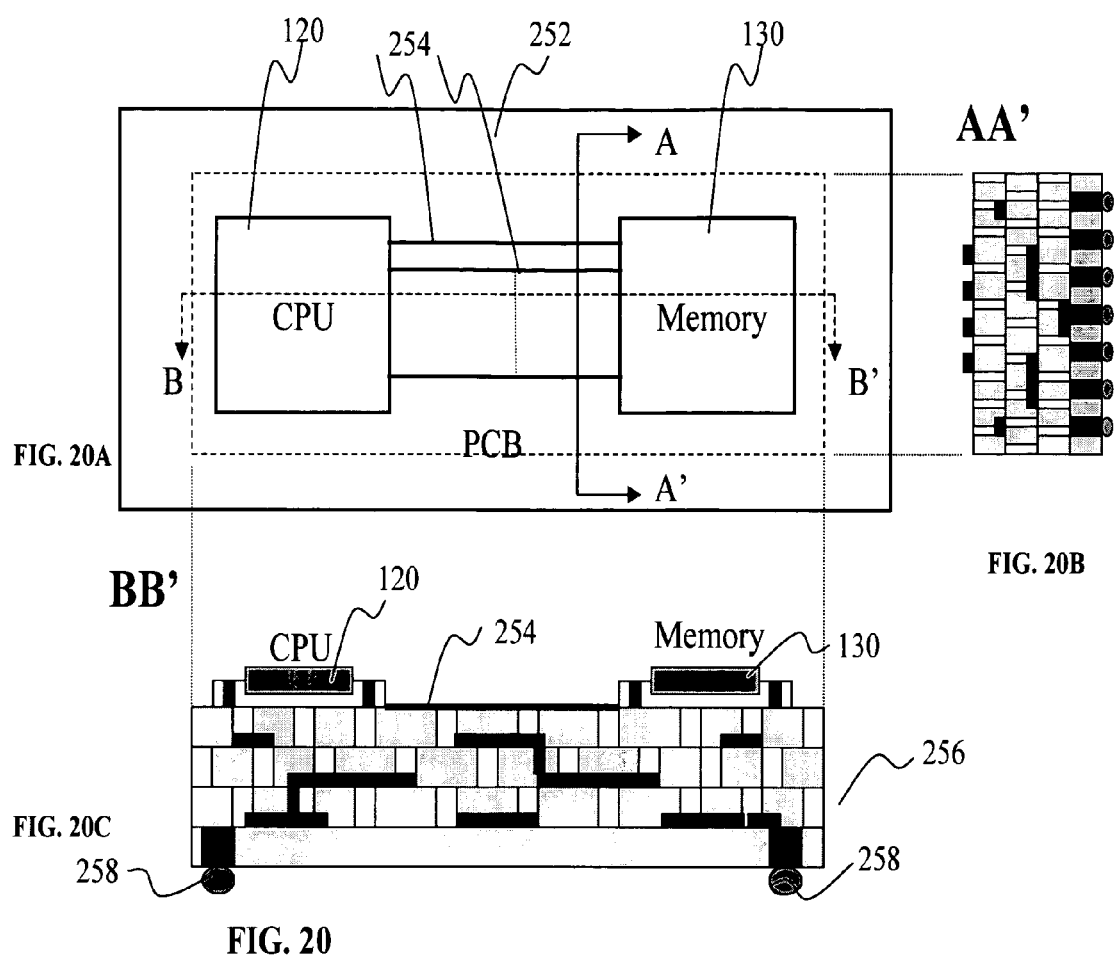
FIG. 20A is a top-view and FIGS. 20B and 20C are side and front cross-sectional views, respectively, along the lines AA' and BB' shown in FIG. 20A, illustrating mountable/stackable inter-chip (off-chip) interconnections consisting of the multilayered PCB in an eleventh preferred embodiment of the invention.

FIG. 20A is a top view and FIGS. 20B and 20C are enlarged cross-sectional views along the lines AA' and BB' shown in FIG. 20A, respectively, in an eleventh preferred embodiment of the invention, wherein like parts are indicated by like numerals so that similar explanations are omitted here. In this example, interconnection between two chips is shown wherein high-speed chips are interconnected on a separate board 256 comprising a periodic dielectric structure. In this exemplary embodiment, a circuit board with the periodic dielectric structure fabricated according to the process described earlier in reference with FIG. 17, is used to connect a processor and a memory device. Each board has pins 258 (FIG. 20C) connected on the outside of the PCB board 256 which is mounted on a second conventional PCB board for ground/power lines and other low speed connections.

The off-chip interconnection system described earlier may advantageously combine one or more periodic dielectric structures described in FIGS. 8A-8C, 9, 10A-10D, 11A-11B, 12, and 13A-13D for reducing the microwave loss. For example, air hole arrays in the periodic dielectric structures may be used without, or with a low dielectric constant material or a liquid crystal polymer.

The low dielectric constant materials may include ceramic materials such as Duroid, FR4, AlN, $Al_2O_3$, Mullite ($3Al_2O_3$: $2SiO_2$), SiC, $SiO_2$, Silicon nitride, Silicon-Oxy-Nitride, BeO, Cordierite (magnesium alumina silicate), BN, Glass (with different compositions), epoxy glass, CaO, MnO, ZrO2, PbO, alkali-halide (e.g. NaBr, NaCl) etc.) etc. Other materials that are used to fill the air holes in a periodic dielectric structures include polyimides and benzocyclobutenes (BCBs) having desired dielectric properties. Polymer dielectric materials also include, but are not limited to, TEFLON, liquid crystal polymer, epoxy, parylene, silicone-polyimide, silicone-gel, and fluorinated ethylene propylene copolymer. It also includes materials of elastomers (e.g. silicone elastomer), monomers, and gels. All polymer materials listed here are available from the manufacturers known to those skilled in the art, for example, Du-pont, Hitachi-Chemical, Mitsui, Mitsubishi-Chemical Industries. Liquid crystal polymer is marketed by GoreTex, Japan.

In the preferred embodiments described earlier in reference with FIGS. 17, 18A-18C, 19A-19C, 20A-20C, the signal lines shown therein are microstrip line type transmission lines. However, the principles of the present invention are applicable to other types of transmission lines such as a strip line type transmission line, or a coplanar waveguide line having a single or multiple signal lines (as single or differential). A second layer (not shown) of a dielectric material using either same dielectric material as the one used in the periodic dielectric structure, or a different dielectric material, may additionally be used on top of the signal lines. The backside slot of an off-chip high-speed interconnection on a PCB, may additionally have a single layer, or multiple layers of one or more dielectric material including a single or multilayered periodic dielectric structure, as shown in FIGS. 10A-D.

High Speed Connectors and Cables:

The principles of this invention described in reference with FIGS. 8A-8C, 10A-10D, and 13A-13D are also applicable in designing and constructing high speed connectors and cables for interfacing/transmitting multigigahertz signals. Reducing the microwave loss by implementing the periodic dielectric structure in the connector or in the backside slots increases the bandwidth of the connectors and cables. The design may be further extended to single or differential connectors and cables.

High-Speed Chip Packaging:

According to techniques described in reference with FIGS. 8A-8C, 10A-10D, and 13A-13D, high-speed chip packaging can be designed. Reducing the microwave loss by implementing the periodic dielectric structure described previously increases the bandwidth of the interconnection that connects the chip to its package. Single or differential pair lines can be designed using the periodic dielectric structure having the lower dielectric loss and dielectric constant. According to the principles of the invention the high-speed interconnection system may be designed, such that high-speed signals flowing through the interconnection are made to flow some portion into the high dielectric constant region and some portion flow through the lower dielectric constant region of the interconnection, for example into air, resulting in a significantly higher interconnection bandwidth.

Several preferred embodiments for high-speed on-chip and off-chip interconnection systems are described to merely illustrate the principles of the invention. More specifically, the interconnection systems described in the exemplary embodiments comprise a microstrip line type transmission lines laid on a periodic dielectric structure. However, stripline type and coplanar waveguide type transmission lines in single or multiple signal lines (including differential line) configuration are included within the scope of the invention. The periodic dielectric structure comprises arrays of spherical or cylindrical air holes, or cells in a dielectric material substrate. The shape of each cell could be any type such as square, or any polynomial shape, and may optionally be filled with a second dielectric material having lower dielectric constant than the dielectric substrate. The effective dielectric constant and dielectric loss tangent of periodic dielectric structure are lower as compared to a uniform dielectric material. Therefore microwave loss of the interconnection system is substantially reduced, resulting in higher bandwidth of the interconnection system.

In some other preferred embodiments described in reference with FIGS. 13A-13D, the periodic dielectric structure may be based on a 2-D or a 3-D photonic or an crystal. Alternatively, the periodic dielectric structure could be based on a fully photonic crystal (where full photonic band-gap effect may be used), or a quasi-photonic crystal.

In the preferred embodiments described, an electrical signal is considered in the signal line of the interconnection system. The interconnections system with certain modification can also be used for controlling and transmitting optical signals, electrical signals, or a combination of both.

The present invention has been described by way of its embodiments. However, those skilled in the art while practicing the invention may affect various changes and modifications that are within the scope of the present invention. Therefore, it must be understood that such changes and modifications are included without departing from the scope and spirit of the invention.

The present invention will find application in high-speed on-chip and off-chip interconnections, where signal speeds of 5 Gb/s and higher are necessary. According to the principles of the invention using conventional materials, the signal speed in the interconnections can ideally be made substantially equal to the speed of light for no-loss transmission lines. The present invention can also be implemented in the high-speed, single or multiple signal connectors, and high-speed cables (not shown). Applications of the invention also include, on-chip interconnections where high-speed electronic chips or electronic chips with optical chips need to be connected. As the bandwidth of the interconnection system can ideally be made close to the bandwidth of optical fiber, future monolithic (and also hybrid in the near future) integration of electronic and optical chips can also be realized without significantly sacrificing the signal speed within the chip. The application of the invention may be extended to include high speed multichip module interconnection, 3-D chip or memory interconnection, high speed parallel system for computer animation and graphics for high speed 2-D or 3-D video transmission, high bandwidth image display, and high speed routers, where high speed electronic switches (or IC) need to be interconnected. Other applications may include high speed (5 Gb/s and higher speed) connectors and cables for high speed board-to-board, rack-to-rack interconnection, and single or multiple high-density signal connections.

It will be understood by those skilled in the art that the foregoing preferred embodiments in the specification are merely illustrative examples to describe the principles of this invention, and that various modifications can be made by those skilled in the art without departing from the scope and spirit of the invention. Although the invention has been described with respect to specific embodiments for complete and clear disclosure, the appended claims are not to be thus limited but are to be construed as embodying all modifications and alternative constructions that may occurred to one skilled in the art which fairly fall within the basic teaching set forth here.

What is claimed is:

1. An interconnection system comprising:
   at least one electrical signal line;
   at least one ground/power line; and
   a dielectric system, wherein the dielectric system is interposed between the at least one electrical signal line and the at least one ground/power line, and wherein the at least one electrical signal line is laid on the dielectric system, said dielectric system further comprising;
   at least one dielectric layer comprised of a first dielectric material including;
      a first dielectric region having a continuous layer of the first dielectric material located under the at least one electrical signal line,
      a second dielectric region located adjacent to both sides of the first dielectric region, the second region further including,
         a plurality of substantially cylindrical holes disposed in the at least one dielectric layer, said plurality of holes arranged in polygonal arrays, and
         a second dielectric material including a liquid crystal polymer deposited within each hole of the plurality of holes,
   such that the second dielectric region exhibits a lower effective dielectric constant as compared to the first dielectric region, and upon changing an electric field in the liquid crystal polymer in the second dielectric region, the effective dielectric loss and signal dispersion in the second dielectric region is controllably reduced and the electrical field intensity near the signal line is controllably localized.

2. The interconnection system of claim 1, wherein the plurality of holes is coated with the liquid crystal using a vapor deposition process.

* * * * *